United States Patent [19]

Ogata et al.

[11] Patent Number: 4,977,531
[45] Date of Patent: Dec. 11, 1990

[54] APPARATUS FOR AUTOMATIC PREPARATION OF MEASUREMENT PROGRAMS

[75] Inventors: Teruaki Ogata; Yuko Sudou, both of Itami, Japan

[73] Assignee: Mitsubishi Denki Kabushiki Kaisha, Japan

[21] Appl. No.: 272,934

[22] Filed: Nov. 18, 1988

[30] Foreign Application Priority Data

Jun. 28, 1988 [JP] Japan .................................. 63-158067

[51] Int. Cl.$^5$ ........................ G01R 31/28; G06F 11/30
[52] U.S. Cl. ........................................ 364/580; 371/27
[58] Field of Search ............... 364/579, 580; 371/21.1, 371/27, 20

[56] References Cited

U.S. PATENT DOCUMENTS

| | | | |
|---|---|---|---|
| 4,550,406 | 10/1985 | Neal ........................................ | 371/20 |
| 4,606,025 | 8/1986 | Peters et al. ........................ | 371/21.1 |

FOREIGN PATENT DOCUMENTS 1133589  3/1983  U.S.S.R. .............................. 364/580

OTHER PUBLICATIONS

Wilber, "Enhancing Device Test Programming Productivity: The Catalyst Automated Test Program Generator", 1985 Int'l Test Conference IEEE 1985 pp. 252–262.

Primary Examiner—Felix D. Gruber
Attorney, Agent, or Firm—Leydig, Voit & Mayer

[57] ABSTRACT

An apparatus for automatically preparing measurement programs is used in operating measurement apparatus for measuring the properties of electronic circuits such as intergrated circuits (ICs). The apparatus includes a measurement quality verification apparatus which modifies and standardizes measurement specifications input through a measurement specifications input apparatus. It further includes a measurement condition setting table preparing apparatus which develops these measurement specifications into a measurement condition setting table, which is transformed into a measurement program by a measurement program transformation apparatus.

11 Claims, 3 Drawing Sheets

APPARATUS FOR AUTOMATIC PREPARATION OF MEASUREMENT PROGRAMS

BACKGROUND OF THE INVENTION

1. Field of the Invention

This invention relates to an apparatus for automatically preparing measurement programs used in operating measurement apparatus for measuring the properties of electronic circuits such as semiconductor integrated circuits (hereinafter referred to as ICs).

2. Description of the Related Art

Generally, the properties of electronic circuits, of which semiconductor integrated circuits are representative, are measured and tested after the circuits are designed and produced, and a measurement apparatus called a general IC test system is used for this purpose. This type of measurement apparatus is generally equipped with a plurality of signal generating means and measuring means, etc. Various measurements and tests can be conducted by operating such means in accordance with relevant measurement programs.

FIG. 4 is a block diagram illustrating the entire configuration of a system for measuring the properties of electronic circuits which utilizes such a measurement apparatus. A measurement apparatus 1 is connected, through the intermediary of a connection cable 2, to a measurement circuit 3. The measurement circuit 3 includes an interface circuit 4 connected to the connection cable 2, a peripheral circuit 5, and a socket jig 6. Connected to the socket jig 6 is an IC 7, which is the object to be tested. Here, the peripheral circuit 5 serves to create the peripheral condition in which the IC is to be actually used and includes a multitude of changeover switches (relays) to enable the IC 7 to be tested.

The measurement apparatus 1 operates in accordance with a measurement program, and an electric signal is input to the IC 7 through the interface 4, the peripheral circuit 5, etc. This causes the IC 7 to operate and the output thereof is transmitted to the measurement apparatus 1 through the peripheral circuit 5 and the interface circuit 4. In this way, various tests are performed on the IC 7 in accordance with the particular measurement program.

Here, the measurement program for operating the measurement apparatus 1, the peripheral circuit 5, and the interface circuit 4 are inherent to the circuit design of the IC 7 to be tested. Conventionally, such a measurement program is prepared by the following procedure:

Step 1: the measurement specifications for the IC 7 are prepared by selecting the items for measurement in accordance with the device specifications prepared when the IC 7 is designed.

Step 2: concrete measurement methods according to the measurement apparatus 1 are examined.

Step 3: the requisite peripheral circuit 5 and the interface 4 for conducting the measurement are designed.

Step 4: the peripheral circuit 5 and the interface circuit 4 are produced and connected to each other. At the same time, the socket jig 6 is connected to the peripheral circuit 5, thereby completing the measurement circuit 3.

Step 5: a measurement program using an exclusive language form for the measurement apparatus 1 is prepared in accordance with the items for measurement and the measurement method of Steps 1 and 2, respectively.

Step 6: the measurement circuit 3 is connected to the measurement apparatus 1 through the connection cable 2. At the same time, the IC 7 is connected to the socket jig 6. Then, the measurement apparatus 1 is operated in accordance with the measurement program in order to conduct operational verification (generally referred to as debug) to see whether the desired measurement can be conducted.

Step 7: the relation between the measurement data obtained in Step 6 and the device specifications of the IC 7 is checked.

Step 8: the order of measurement is examined again for the purpose, for example, of shortening the measurement time or improving the quality of the data.

Step 9: the final specifications of the measurement program and the measurement circuit 3 are prepared.

If the desired measurement data cannot be obtained in Step 7, it is necessary to repeat Steps 2 through 7 to prepare the measurement program and the measurement circuit again. If the desired measurement still cannot be obtained, the measurement specifications of the IC 7 may be changed.

Measurement programs have been prepared that follow such steps as those described above. Traditionally, Step 1 was performed by a designer of the IC 7 and Steps 2 through 9 by a specialist testing engineer.

Steps 2 through 9 had to be performed by a testing engineer having a thorough knowledge of the hardware and software of each model of the existing measurement apparatus 1 using different tester languages according to the language forms inherent to them.

As described above, the preparation of the measurement programs has been entirely dependent on human labor, requiring a great amount of effort and time. Further, because of this dependence on human effort, it has been subject to human error and the quality of measurement programs has been greatly influenced by the depth of knowledge and experience of the testing engineer.

SUMMARY OF THE INVENTION

This invention is aimed at overcoming the above problems. It is accordingly an object of this invention to provide an apparatus for the automatic preparation of measurement programs used in operating measurement apparatuses for measuring the properties of electronic circuits such as ICs.

The apparatus for automatic preparation of measurement programs in accordance with this invention comprises:

measurement specifications input means for inputting measurement specifications for an electronic circuit;

measurement quality verification means for comparing the measurement specifications input through said measurement specifications input means with previously set standard measurement specifications and modifying said measurement specifications input according to the result of the comparison;

measurement condition setting table preparing means for developing the measurement specifications modified by said measurement quality verification means into a measurement condition setting table having a form that allows it to be easily adapted to the hardware of a measurement apparatus;

a language transformation data base including a program language dictionary corresponding to the measurement apparatus; and measurement program transformation means for transforming the measurement condition setting table prepared by means of said measurement condition setting table preparing means, using the program language dictionary in said language transformation data base, into a measurement program.

In accordance with this invention, the measurement quality verification means modifies and standardizes measurement specifications input through the measurement specifications input means, the measurement condition setting table preparing means develops these measurement specifications into a measurement condition setting table, and the measurement program transformation means transforms this measurement condition setting table into a measurement program.

DETAILED DESCRIPTION OF THE PREFERRED EMBODIMENTS

Figure 1:
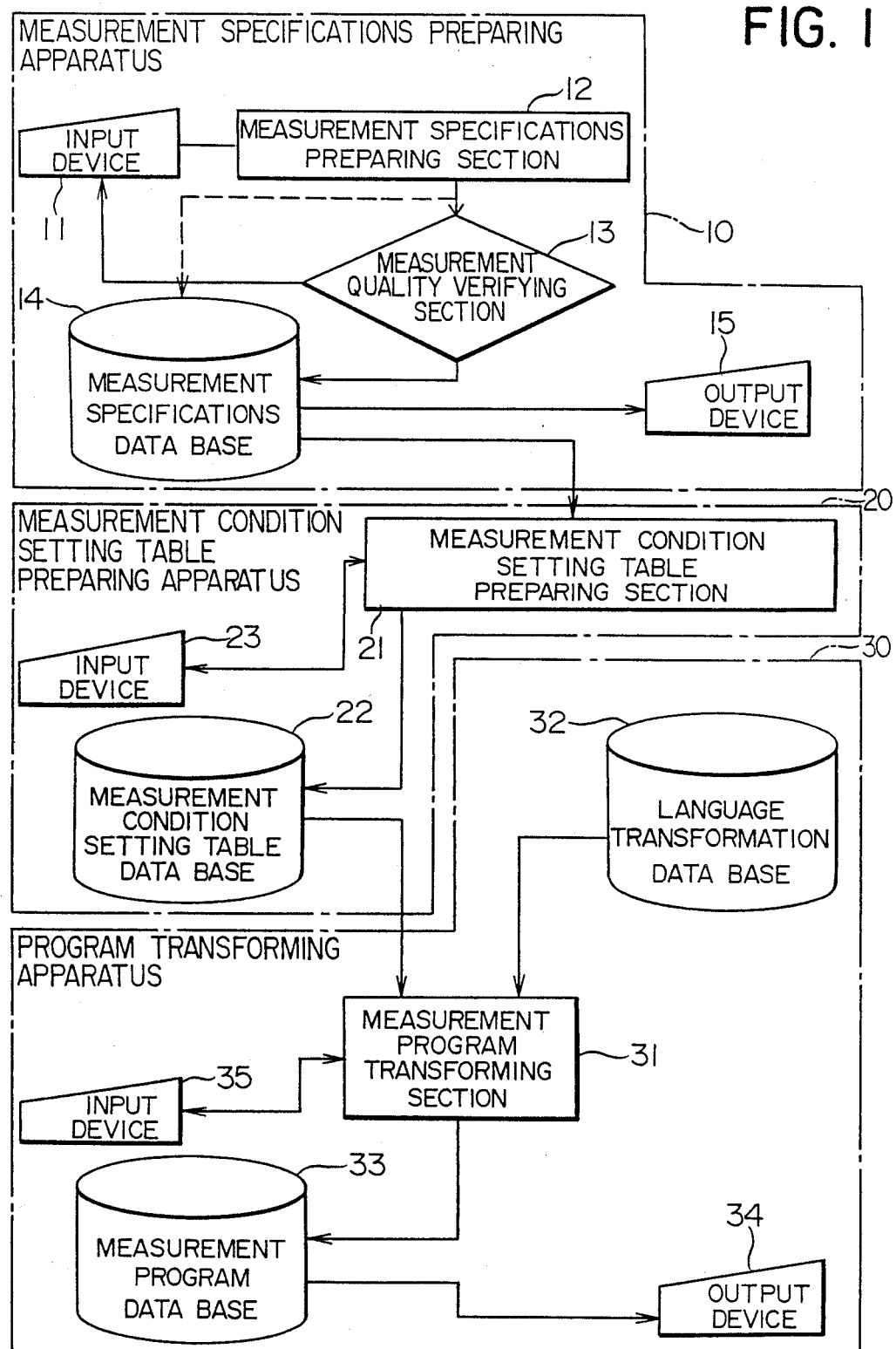
FIG. 1 is a block diagram showing an embodiment of the apparatus for automatic preparation of measurement programs in accordance with this invention.

Embodiments of this invention will now be described with reference to the attached drawings As shown in FIG. 1, an apparatus for the automatic preparation of the measurement programs comprises measurement specifications preparing apparatus 10, a measurement condition setting table preparing apparatus 20 connected to this measurement specifications preparing apparatus 10, and a program transforming apparatus 30 connected to this measurement condition setting table preparing apparatus 20.

The measurement specifications preparing apparatus 10 has an input device 11 for entering the measurement specifications for an IC which is the object of measurement. The input device 11, which is equipped, for example, with a display such as a CRT, as well as a keyboard, is connected to a measurement specifications preparing section 12. This measurement specifications preparing section 12 is of the type in which measurement specifications are successively input through the input device 11 in a conversation form using a general language. This measurement specifications preparing section 12 forms, together with the input device 11, a measurement specifications input means.

Connected to this measurement specifications preparing section 12 is a measurement quality verifying section 13 which forms the measurement quality verification means. The measurement quality verifying section 13 serves, on the one hand, to prevent inadequate measurement specifications from being prepared. For this purpose, previously set in this measurement quality verifying section 13 are standard measurement specifications including various measurement items such as measurement of leakage characteristics attributable to the semiconductor structure, verification of non-connected terminals (NC terminals) attributable to the package structure, and measurement for guaranteeing reliability based on past experience. The measurement quality verifying section 13 provides standard specifications of each of the factors determining measurement specifications such as measurement method, conditions, and measurement sequence. This enables the designer to selectively prepare specifications following a conversational form. Thus, it is aimed at standardizing the measurement specifications themselves for the purpose of facilitating the preparation of a measurement condition setting table. Such standard measurement specifications are compared with those actually prepared in the measurement specifications preparing section 12, and the result of the comparison is fed back to the input device 11, thereby making it possible to modify, add or delete measurement specifications and standardizing the form of measurement specifications.

A measurement specifications data base 14 which stores the measurement specifications prepared in the measurement specifications preparing section 12 and the measurement quality verifying section 13 is connected to the measurement specifications preparing section 12 and the measurement quality verifying section 13. An output device 15 is connected to this measurement specifications data base 14, which enables the measurement specifications to be output in a definite form, for example, in the form of delivery specifications of electronic circuits.

The measurement specifications preparing apparatus 10 is formed by the input device 11, the measurement specifications preparing section 12, the measurement quality verifying section 13, the measurement specifications data base 14 and the output device 15.

The measurement condition setting table preparing apparatus 20 includes a measurement condition setting table preparing section 21 connected to the data base 14 of the measurement specifications preparing apparatus 10. This measurement condition setting table preparing section 21 forms the measurement condition setting table preparing means and serves to transform measurement specifications prepared in the measurement specifications preparing apparatus 10 into a measurement condition setting table having a form allowing it to be easily adapted to the hardware of a standard measurement apparatus (not shown). Connected to this measurement condition setting table preparing section 21 is an input device 23 for enabling change and modification of measurement condition setting tables and a measurement condition setting table data base 22 for storing measurement condition setting tables prepared in the measurement condition setting table preparing section 21. The measurement condition setting table preparing section 21, the measurement condition setting table data base 22 and the input device 23 form the measurement condition setting table preparing apparatus 20.

A measurement program transforming section 31 of a program transforming apparatus 30 is connected to the data base 22 of the measurement condition setting table preparing apparatus 20. The program transforming section 31 is also connected to a language transformation data base 32. The language transformation data base 32 is equipped with a plurality of program language dictionaries corresponding to the various measurement apparatus models (not shown). The measurement program transforming section 31 forms the measurement program transforming means and serves to transform the measurement condition setting table prepared in the measurement condition setting table preparing apparatus 20 into a measurement program adapted to the particular measurement apparatus (not shown).

An input device 35 for enabling measurement apparatus selection is connected to the measurement program transforming section 31. A measurement program data base 33 is also connected to the measurement program transforming section 31. The measurement program data base 33 stores measurement programs prepared in the measurement program transforming section 31. Further, an output device 34 is connected to this data base 33. This output device 34 serves to medium-transform the measurement program into a form allowing it to be processed by the measurement apparatus used and to output the program thus transformed.

The program transforming apparatus 30 is formed by the measurement program transforming section 31, the language transformation data base 32, the measurement program data base 33, the output device 34, and the input device 35.

The operation of this embodiment will now be described.

First, the operator, who may be the designer of the electronic circuit which is the object to be measured, inputs the measurement specifications through the input device 11 of the measurement specifications preparing apparatus 10. At this time, questions in a conversation form using a general language regarding the measurement specifications are successively displayed on the display of the input device 11 by the measurement specifications preparing section 12 and the operator answers these questions one by one while referring to the device specifications of the electronic circuit concerned. The questions may be about, for example, the name and symbol of the measurement item, the minimum and maximum values specified, the measurement mode, the decision on whether terminal conditions are to be set or not, the terminal number and setting conditions when the terminal conditions are to be set, etc.

With this input operation of the measurement specifications, the measurement specifications input to the measurement specifications preparing section 12 are compared with the previously set standard measurement specifications in the measurement quality verifying section 13, and the result of the comparison, whenever necessary, is fed back to the input device 11. This enables the measurement specifications to be modified, added or deleted, standardizing, at the same time, the form of the measurement specifications.

The measurement specifications thus prepared are stored in the measurement specifications data base 14. These measurement specifications are output through the output device 15 whenever necessary.

The measurement specifications in the measurement specifications data base 14 are input to the measurement condition setting table preparing section 21 of the measurement condition setting table preparing apparatus 20, where they are transformed into a measurement condition setting table having a form that allows it to be easily adapted to the hardware of a standard measurement apparatus (not shown). This measurement condition setting table can be changed or modified in accordance with commands from the input device 23. After that, the measurement condition setting table is stored in the data base 22 connected to the measurement condition setting table preparing section 21.

The measurement condition setting table thus prepared in the measurement condition setting table preparing apparatus 20 is output from the data base 22 and transmitted to the program transforming section 31 of the program transforming apparatus 30, where it is transformed into a measurement program. The measurement apparatus (not shown) is selected at the input device 35 of the program transforming apparatus 30, and the measurement program transforming section 31 selects out of the language transformation data base 32 the program dictionary corresponding to the selected measurement apparatus. The program transformation of the measurement condition setting table is conducted using this program language dictionary.

The measurement program thus prepared is stored in the measurement program data base 33; after that, it is medium-transformed by the output device 34 into a form that allows it to be processed in the measurement apparatus and output thereto.

In this way, the measurement program adapted to the particular measurement apparatus is prepared.

A more concrete embodiment of the measurement program preparation will now be described.

Figure 2:
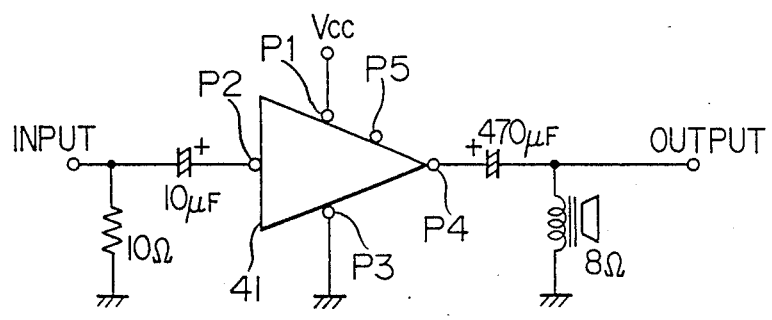
FIG. 2 is a circuit diagram showing an electronic circuit which is the object to be measured in this embodiment and peripheral circuits around the electronic circuit in use.

FIG. 2 shows an IC 41 for audio amplification and peripheral circuits to this IC 41 when it is being used. The IC 41 is equipped with five pins P1 to P5 and has device specifications such as that shown in Table 1.

TABLE 1

| | |
|---|---|
| Input voltage range | From 0.1 to 10mVrms |
| Voltage gain | 46 ± 3dB |
| Distortion rate | 0.1% or less |
| Frequency characteristic | 20 to 20000Hz |
| Noise voltage converted into input | 5.0 μVrms or less |
| Maximum output | 2W at THD 10% |
| Power source voltage | 12 ± 1.8V |
| No signal current | 20 to 40mA |

First, the operator inputs the measurement specifications for the IC 41 in a conversation form through the input device 11 while referring to the device specifications of the IC 41. In doing so, the operator sets the measurement conditions in such a way that the device specifications can be sufficiently measured. The measurement quality verifying section 13 performs verification of whether the measurement items such as checking of the voltages at the input and output terminals, NC terminal connection checking, and input leakage current checking, were included in the measurement specifications set by the operator. If they are not included, these items are displayed on the display of the input device 11 to complete the measurement specifications.

Figure 3:
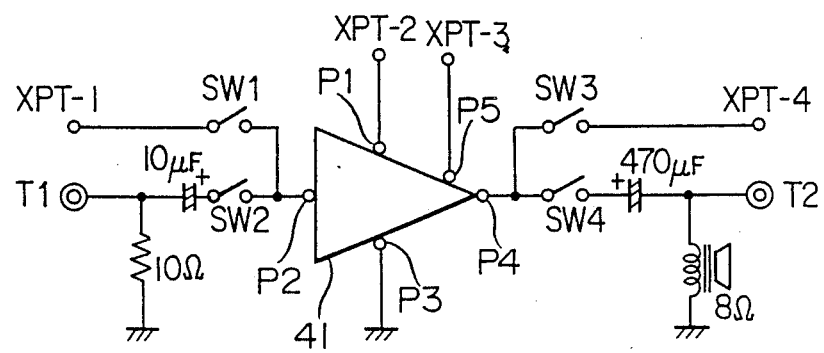
FIG. 3 is a circuit diagram showing change-over switches for measurement which are added to the circuits of FIG. 2.
Figure 4:
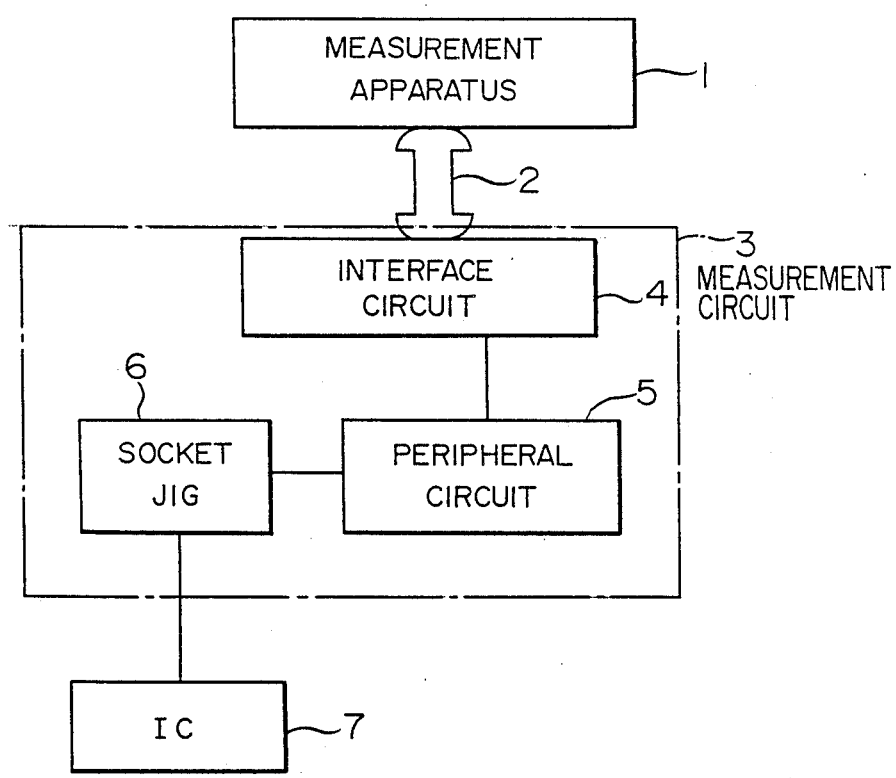
FIG. 4 is a block diagram showing a conventional apparatus for testing electronic circuits.

FIG. 3 shows a peripheral circuit designed to perform the items of the measurement specifications thus prepared. This circuit is obtained by adding change-over switches SW1 through SW4 as well as terminals XPT-1 through XPT-4 to the circuit shown in FIG. 2. In performing a test, the input terminal T1 and the output terminal T2 are connected to an audio source (power) in the measurement apparatus (not shown) and an audio voltmeter (measuring instrument), respectively.

The measuring specifications prepared in the measurement specifications preparing apparatus 10 are transformed into the measurement condition setting table shown in Tables 2 and 3 by the measurement condition setting table preparing apparatus 20.

It is to be appreciated from this measurement condition setting table that when, for example, verifying the non-connected condition of pin P5, the NC terminal of the IC 41, change-over switches SW1 and SW3 are turned to ON and change-over switches SW2 and SW4 to OFF. The measurement is performed by applying a power voltage of 12 V to terminal XPT-2 and allowing a current of 10 μA to flow from terminal XPT-3.

TABLE 2

| Items | Terminal conditions | | | | Audio Source | Change-over switches | | | |
|---|---|---|---|---|---|---|---|---|---|
| | XPT-1 | XPT-2 | XPT-3 | XPT-4 | | SW1 | SW2 | SW3 | SW4 |
| Voltage gain | | 12V | | | 1KHz, 1mVrms | OFF | ON | OFF | ON |
| Full harmonic wave distortion rate | | 12V | | | Adjusted to 1KHz, 1Vrms output | OFF | ON | OFF | ON |
| Frequency characteristic | | 12V | | | 10KHz, 1mVrms | OFF | ON | OFF | ON |
| Noise voltage converted into input | | 12V | | | OFF | OFF | ON | OFF | ON |
| Maximum output | | 12V | | | Adjusted to 1KHz, THD 10% | OFF | ON | OFF | ON |
| No signal current | | 12V | | | | OFF | ON | OFF | ON |
| . | | | | | | | | | |
| . | | | | | | | | | |
| Pin P2 voltage | 10 μA | 12V | | | | ON | OFF | ON | OFF |
| Pin P4 voltage | | 12V | | 10 μA | | ON | OFF | ON | OFF |
| Pin P5 NC check | | 12V | 10 μA | | | ON | OFF | ON | OFF |
| Pin P2 leakage current | 0.4V | | | | | ON | OFF | ON | OFF |

TABLE 3

| Items | Measurement conditions | Rated value |
|---|---|---|
| Voltage gain | Audio voltmeter | 140 to 280mVrms |
| Full harmonic wave distortion rate | Audio voltmeter | 0 to 0.1% |
| Frequency characteristic | Audio voltmeter | ±3dB of voltage gain |
| Noise voltage converted into input | Audio voltmeter | 0.1 to 1.4mVrms |
| Maximum output | Audio voltmeter | 5.6Vo-p~ |
| No signal current | Constant-voltage regulated power | 20 to 40mA |
| . | | |
| . | | |
| Pin P2 voltage | Constant-current regulated power | 1.0 to 1.4V |
| Pin P4 voltage | Constant-current regulated power | 1.0 to 1.4V |
| Pin P5 NC check | Constant-current regulated power | 1.90 to 2.10V(2V clamp) |
| Pin P2 leakage current | Constant-voltage regulated power | −0.10 to 1.00 μA |

Subsequently, the measurement program is prepared from this measurement condition setting table by the program transforming apparatus 30. This measurement program serves to control the switching between ON and OFF of the audio source, the setting of change-over switches SW1 through SW4 of the peripheral circuit, etc. so that the measurement may be performed successively on each of the items in the measurement condition setting table in accordance with the measurement conditions therein. This measurement program is medium-transformed by the output device 34 and output.

Since a measurement apparatus generally employs a tester language according to the language form inherent in it, it is necessary to use a program language adapted to the model of the measurement apparatus used. As described above, however, the program transforming apparatus 30 stores in its language transformation data base 32 a plurality of program language dictionaries of commands employed by measurement apparatus of different models, so that the measurement program using a program language suited to the measurement apparatus to be used can be prepared with ease.

Further, the measurement order and the measurement condition can be easily changed by a general language input operation at the input device 11.

The measurement specification preparing apparatus 10, the measurement condition setting table preparing apparatus 20 and the program transforming apparatus 30 may be separated from each other, by means of personal computers or the like. Or, they can be incorporated in a single system under the same computer.

It is also possible to input a peripheral circuit diagram at the input device 11 or some other input apparatus to the measurement specifications preparing apparatus 10 and to automatically arrange the requisite change-over switches and terminals for the peripheral circuit diagram while preparing the measurement specifications.

Further, an on-line connection may be effected between the output device 34 for outputting measurement programs and the measurement apparatus so that the measurement apparatus can be directly controlled by this apparatus for automatic preparation of measurement programs, reducing the time for processing between the input device 11 and the output device 34. This enables the debug operation to be effected by a general language input through the input device 11, thereby facilitating the debug operation.

What is claimed is:

1. An apparatus for preparing measurement programs used in operating one of a plurality of measurement apparatus for measuring the properties of an electronic circuit comprising.
    measurement specifications input means for inputting measurement specifications for the electronic circuit;
    measurement quality verification means connected to said measurement specifications input means for comparing the measurement specifications input through said measurement specifications input means with previously set standard measurement specifications and for modifying the measurement specifications input according to the result of the comparison, said measurement quality verification means having an output for outputting modified measurement specifications;

measurement condition setting table preparing means having an input for receiving the modified measurement specifications prepared by said measurement quality verification means for developing the modified measurement specifications into a measurement condition setting table having a form that allows the measurement condition setting table to be easily adapted to the hardware of said measurement apparatus, said measurement condition setting table preparing means having an output for outputting the measurement condition setting table;

a language transformation data base including a program language dictionary corresponding to said measurement apparatus; and measurement program transforming means having a first input connected to said language transformation data base and having a second input for receiving the measurement condition setting table prepared by said measurement condition setting table preparing means for transforming the measurement condition setting table prepared by said measurement condition setting table preparing means, using the program language dictionary in said language transformation data base, into a measurement program, said measurement program transforming means having an output for outputting the measurement program.

2. An apparatus as claimed in claim 1, wherein said measurement specifications input means includes a first input device and a measurement specifications preparing section connected to input the measurement specifications for said electronic circuit successively through said first input device in a conversation form using a general language.

3. An apparatus as claimed in claim 2, wherein said first input device includes a display and a keyboard.

4. An apparatus as claimed in claim 1, wherein said measurement quality verification means includes means for standardizing a form of measurement specifications by modifying the measurement specifications.

5. An apparatus as claimed in claim 1 further comprising a measurement specifications data base having an input connected to the output of said measurement quality verification means for receiving and storing the measurement specifications modified by said measurement quality verification means and having a first output connected to the input of said measurement condition setting table preparing means.

6. An apparatus as claimed in claim 5 wherein said measurement specifications data base has a second output and a first output device is connected to the second output for outputting the measurement specifications stored in said measurement specifications data base in a definite form.

7. An apparatus as claimed in claim 1 wherein said measurement condition setting table preparing means has a second input and a second input device is connected to the second input for receiving instructions for modification of the measurement condition setting table and connected to provide the instructions to said measurement condition setting table preparing means.

8. An apparatus as claimed in claim 1 further comprising a measurement condition setting table data base having an input connected to the output of said measurement condition setting table preparing section for receiving and storing the measurement condition setting table prepared by said measurement condition setting table preparing means and having an output connected to the second input of said measurement program transforming means.

9. An apparatus as claimed in claim 1 wherein said measurement program transformation means has a third input and a third input device is connected to the third input for selecting one of the plurality of measurement apparatus and inputting a result of the selection to said measurement program transforming means.

10. An apparatus as claimed in claim 1 further comprising a measurement program data base connected to the output of said measurement program transforming means to receive and store the measurement program obtained by said measurement program transforming means.

11. An apparatus as claimed in claim 10 further comprising a second output device having an input connected to said measurement program data base for receiving the stored measurement program and for medium-transforming the stored measurement program into a form that allows the measurement program to be processed by the selected measurement apparatus and for outputting the medium-transformed measurement program.

* * * * *